United States Patent
Olson et al.

(10) Patent No.: US 7,202,483 B2
(45) Date of Patent: Apr. 10, 2007

(54) METHODS AND APPARATUS FOR ION BEAM ANGLE MEASUREMENT IN TWO DIMENSIONS

(76) Inventors: Joseph C. Olson, 5 Meeting Place Cir., Beverly, MA (US) 01915; Eric D. Hermanson, 360 North St., Georgetown, MA (US) 01833; Rosario Mollica, 16 Freeport Dr., Wilmington, MA (US) 01887; Paul J. Murphy, 343 South St., Reading, MA (US) 01867

( * ) Notice: Subject to any disclaimer, the term of this patent is extended or adjusted under 35 U.S.C. 154(b) by 90 days.

(21) Appl. No.: 11/099,119

(22) Filed: Apr. 5, 2005

(65) Prior Publication Data

US 2006/0219936 A1    Oct. 5, 2006

(51) Int. Cl.
  G01K 1/08    (2006.01)
  H01J 3/14    (2006.01)

(52) U.S. Cl. .................................. 250/397; 250/492.21
(58) Field of Classification Search .................... None
  See application file for complete search history.

(56) References Cited

U.S. PATENT DOCUMENTS

2004/0195528 A1 * 10/2004 Reece et al. ........... 250/492.21

* cited by examiner

Primary Examiner—Nikita Wells
Assistant Examiner—Zia R. Hashmi
(74) Attorney, Agent, or Firm—Varian Semiconductor Equipment Associates, Inc.

(57) ABSTRACT

An angle measurement system for an ion beam includes a flag defining first and second features, wherein the second feature has a variable spacing from the first feature, a mechanism to translate the flag along a translation path so that the flag intercepts at least a portion of the ion beam, and a sensing device to detect the ion beam for different flag positions along the translation path and produce a sensor signal having a first signal component representative of the first feature and a second signal component representative of the second feature. The first and second signal components and corresponding positions of the flag are representative of an angle of the ion beam in a direction orthogonal to the translation path. The sensing device may be a two-dimensional array of beam current sensors. The system may provide measurements of horizontal and vertical beam angles while translating the flag in only one direction.

27 Claims, 11 Drawing Sheets

METHODS AND APPARATUS FOR ION BEAM ANGLE MEASUREMENT IN TWO DIMENSIONS

FIELD OF THE INVENTION

This invention relates to systems and methods for ion implantation and, more particularly, to methods and apparatus for measuring the incidence angle and/or parallelism of an ion beam in two dimensions.

BACKGROUND OF THE INVENTION

Ion implantation is a standard technique for introducing conductivity—altering impurities into semiconductor wafers. A desired impurity material is ionized in an ion source, the ions are accelerated to form an ion beam of prescribed energy and the ion beam is directed at the surface of the wafer. The energetic ions in the beam penetrate into the bulk of the semiconductor material and are embedded into the crystalline lattice of the semiconductor material to form a region of desired conductivity.

Ion implantation systems usually include an ion source for converting a gas or a solid material into a well-defined ion beam. The ion beam is mass analyzed to eliminate undesired ion species, is accelerated to a desired energy and is directed onto a target plane. The beam may be distributed over the target area by beam scanning, by target movement or by a combination of beam scanning and target movement.

In one prior art approach, a high current, broad beam ion implanter employs a high current density ion source, an analyzing magnet to direct a desired species through a resolving slit and an angle corrector magnet to deflect the resulting beam, while rendering the beam parallel and uniform along its width dimension. A ribbon-shaped ion beam is delivered to a target, and the target is moved perpendicular to the long dimension of the ribbon beam to distribute the ion beam over the target.

The delivery to a semiconductor wafer of a parallel ion beam at a known incidence angle is an important requirement in many ion implantation applications. A parallel ion beam is one which has parallel ion trajectories over the surface of the semiconductor wafer. In cases were the ion beam is scanned, the scanned beam is required to maintain parallelism over the wafer surface. The parallel ion beam prevents channeling of incident ions in the crystal structure of the semiconductor wafer or permits uniform channeling in cases where channeling is desired. In addition, a parallel ion beam at a known incidence angle is required in tilted implant applications to ensure uniform results. These requirements have made it necessary to measure beam parallelism and direction and to adjust these parameters if necessary. Techniques for adjusting beam parallelism in ion implanters are disclosed in U.S. Pat. No. 6,437,350, issued Aug. 20, 2002 to Olson, et al.

One known approach to measuring ion beam angle is disclosed in U.S. Pat. No. 6,791,094, issued Sep. 14, 2004 to Olson et al. An object is placed in the ion beam, and the size and relative position of the shadow cast by the object is measured. An ion beam incidence angle and beam divergence monitor is disclosed by Larsen et al. in U.S. Patent Publication No. 2002/0121889 A1, published Sep. 5, 2002. The measurement device uses an aperture and a variable resistor to measure implant angle. Both of the disclosed techniques have a limitation in that they are capable of providing angle information in only one dimension. Moving the apparatus across the beam permits measurement only in the direction of motion. To make measurements in another direction, an additional or more complex mechanism is necessary to drive the object or slit in the desired direction.

Additional techniques for measuring ion beam angle are disclosed in U.S. Pat. No. 5,039,861, issued Aug. 13, 1991 to Swenson; U.S. Pat. No. 5,180,918, issued Jan. 19, 1993 to Isobe; and U.S. Pat. No. 5,898,179, issued Apr. 27, 1999 to Smick et al. All of the known prior art ion beam angle measuring techniques have had one or more disadvantages, including limited angle measuring capabilities, lack of accuracy and high cost.

Accordingly, there is a need for new and improved methods and apparatus for measuring ion beam incidence angles.

SUMMARY OF THE INVENTION

According to a first aspect of the invention, an angle measurement system for an ion beam is provided. The angle measurement system comprises a flag defining a first feature and a second feature, wherein the second feature has a variable spacing from the first feature as a function of location on the second feature, a mechanism to translate the flag along a translation path so that the flag intercepts at least a portion of the ion beam, and a sensing device to detect the ion beam for different flag positions along the translation path and to produce in response to the detected ion beam a sensor signal having a first signal component representative of the first feature and a second signal component representative of the second feature. The first and second signal components and corresponding positions of the flag are representative of an angle of the ion beam in a direction orthogonal to the translation path.

In various embodiments, at least one of the first and second features of the flag comprises a slot in the flag, an outside edge of the flag, or an inside edge of an aperture in the flag. In one embodiment, the first feature comprises a slot in the flag and the second feature comprises an angled edge of the flag. The first and second features may be straight and may be oriented at an acute angle.

The sensing device may comprise one or more beam current sensors positioned to intercept the ion beam. In one embodiment, the sensing device comprises a two-dimensional array of beam current sensors. In another embodiment, the sensing device comprises a linear array of beam current sensors. The flag may be translated along a horizontal translation path.

The angle measurement system may further comprise a processing device. The processing device may process the sensor signal to provide a measurement of horizontal beam angle, vertical beam angle, or both. In the case of a two-dimensional array of beam current sensors, the processing device may generate a map of horizontal beam angle and vertical beam angle as a function of position in the ion beam. The horizontal and vertical beam angle measurements from individual beam current sensors may be averaged. For example, horizontal and vertical beam angle measurements may be averaged along a vertical column of beam current sensors to provide average vertical and horizontal beam angles at a given X coordinate. Horizontal and vertical beam angle measurements may be averaged over the entire array to provide overall average horizontal and beam angle measurements.

The measured beam angles may be compared with a predetermined criteria. If the measured beam angles meet the predetermined criteria, ion implantation may proceed. If the measured beam angles do not meet the predetermined criteria, the beam angles may be adjusted, or a substrate may be tilted relative to the ion beam.

According to a second aspect of the invention, a method is provided for measuring an incidence angle of an ion beam on a substrate plane. The method comprises providing a flag defining a first feature and a second feature, wherein the second feature has a variable spacing from the first feature as a function of location on the second feature, translating the flag along a translation path so that the flag intercepts at least a portion of the ion beam, and detecting the ion beam for different flag positions along the translation path and producing in response to the detected ion beam a sensor signal having a first signal component representative of the first feature and a second signal component representative of the second feature. The first and second signal components and corresponding positions of the flag are representative of an angle of the ion beam in a direction orthogonal to the translation path.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
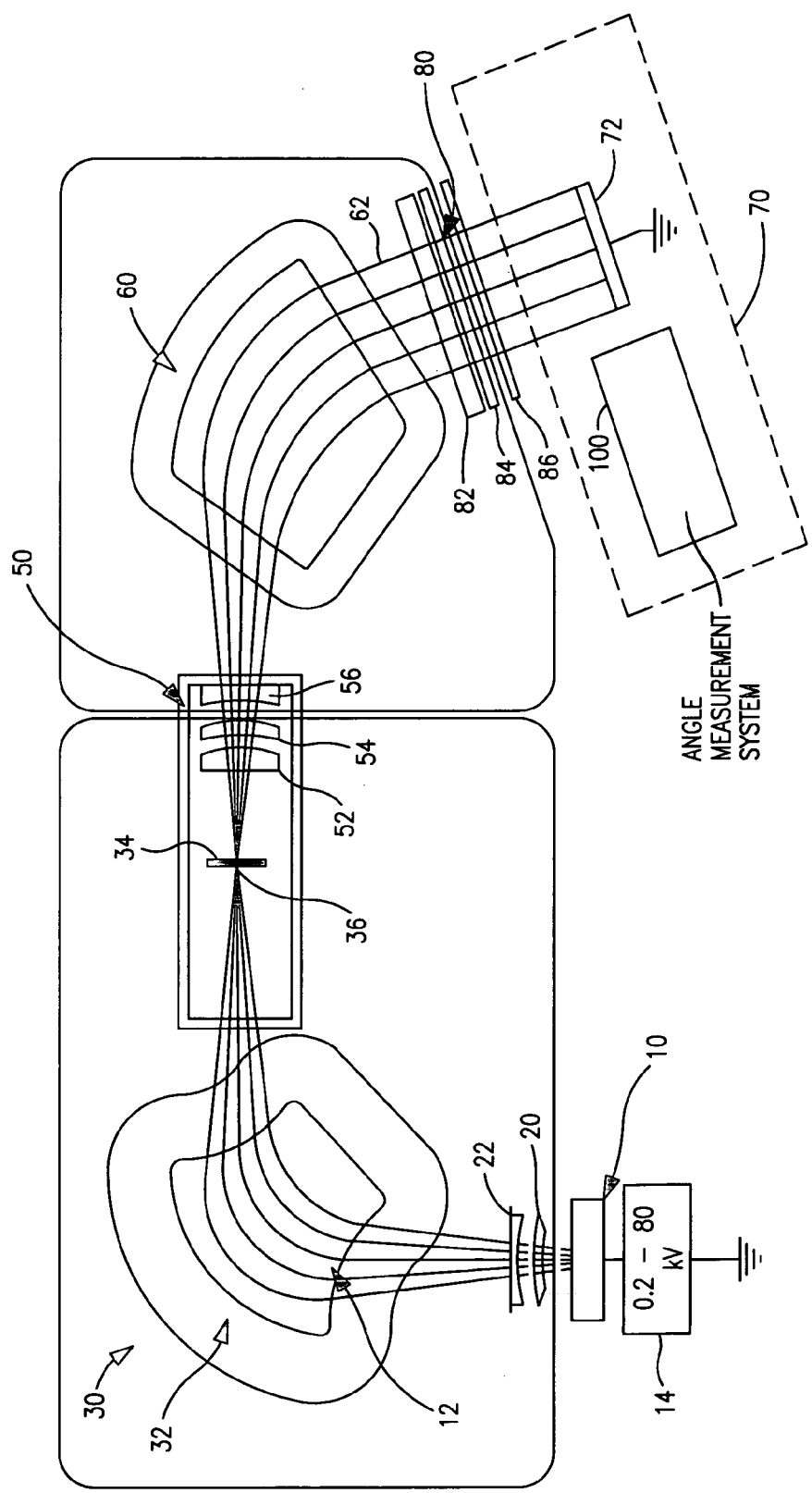
FIG. 1 is a simplified schematic diagram of an ion implanter incorporating an angle measurement system in accordance with an embodiment of the invention.

A block diagram of an embodiment of an ion implanter is shown in FIG. 1. An ion source 10 generates ions and supplies an ion beam 12. Ion source 10 may include an ion chamber and a gas box containing a gas to be ionized. The gas is supplied to the ion chamber where it is ionized. The ions thus formed are extracted from the ion chamber to form ion beam 12. Ion beam 12 is directed between the poles of a resolving magnet 32. A first power supply 14 is connected to an extraction electrode of ion source 10 and provides a positive first voltage $V_0$. First voltage $V_o$ may be adjustable, for example, from about 0.2 to a 80 kV. Thus, ions from ion source 10 are accelerated to energies of about 0.2 to 80 KeV by the first voltage $V_0$.

Ion beam 12 passes through a suppression electrode 20 and a ground electrode 22 to a mass analyzer 30. The mass analyzer 30 includes resolving magnet 32 and a masking electrode 34 having a resolving aperture 36. Resolving magnet 32 deflects ions in ion beam 12 such that ions of a desired ion species pass through resolving aperture 36 and undesired ion species do not pass through resolving aperture 36 but are blocked by the masking electrode 34. In one embodiment, resolving magnet 32 deflects ions of the desired species by 90°.

Ions of the desired ion species pass through resolving aperture 36 to a first deceleration stage 50 positioned downstream of mass analyzer 30. Deceleration stage 50 may include an upstream electrode 52, a suppression electrode 54 and a downstream electrode 56. Ions in the ion beam may be decelerated by deceleration stage 50 and then pass through an angle corrector magnet 60. Angle corrector magnet 60 deflects ions of the desired ion species and converts the ion beam from a diverging ion beam to a ribbon ion beam 62 having substantially parallel ion trajectories. In one embodiment, angle corrector magnet 60 deflects ions of the desired ion species by 70°.

An end station 70 supports one or more semiconductor wafers, such as wafer 72, in the path of ribbon ion beam 62 such that ions of the desired species are implanted into the semiconductor wafer. The end station 70 may include a cooled electrostatic platen and a scanner (not shown) for moving wafer 72 perpendicular to the long dimension of the ribbon ion beam 62 cross-section, so as to distribute ions over the surface of wafer 72. The ribbon ion beam may be at least as wide as wafer 72.

The ion implanter may include a second deceleration stage 80 positioned downstream of angle corrector magnet 60. Deceleration stage 80 may include an upstream electrode 82, a suppression electrode 84 and a downstream electrode 86.

The ion implanter may include additional components known to those skilled in the art. For example, end station 70 typically includes automated wafer handling equipment for introducing wafers into the ion implanter and for removing wafers after ion implantation. End station 70 may also include a dose measuring system, an electron flood gun and other known components. It will be understood that the entire path traversed by the ion beam is evacuated during ion implantation.

The ion implanter of FIG. 1 may operate in one of several modes. In a first operating mode, known as the drift mode, deceleration stages 50 and 80 are connected to ground, and the ion beam 12 is transported through the beamline at the final beam energy established after extraction from ion source 10. In a second operating mode, known as the enhanced drift mode, the ion beam 12 is accelerated to an intermediate energy at electrode 22 before passing through mass analyzer 30 and then is decelerated to the final beam energy by first deceleration stage 50. In a third operating mode, known as the double deceleration mode, the ion beam is accelerated to a first intermediate energy at electrode 22 before passing through mass analyzer 30, is decelerated by first deceleration stage 50 to a second intermediate energy as it passes through angle corrector 60 and then is decelerated to the final beam energy by second deceleration stage 80. A fourth operating mode transports the beam at the intermediate energy through to the second deceleration stage 80, and the gap at the first deceleration stage 50 is operated with a short circuit shunt. By transporting the ion beam through part of the beamline at higher energy, space charge expansion can be reduced in comparison with the drift mode for a given final beam energy.

In accordance with an aspect of the invention, end station 70 may include an angle measurement system 100 as shown in FIG. 1. Angle measurement system 100 is configured to measure ion beam angles in one or both of two orthogonal directions. Typically, ion beam angles with respect to a substrate plane 110 are of interest. However, angle measurement system 100 can measure ion beam angles with respect to any desired plane. It is useful to define a coordinate system wherein the origin is at the center of a wafer positioned for ion implantation in substrate plane 110, the X axis is horizontal and in substrate plane 110, the Y axis is vertical and in substrate plane 110, and the Z axis is perpendicular to substrate plane 110.

Figure 2:
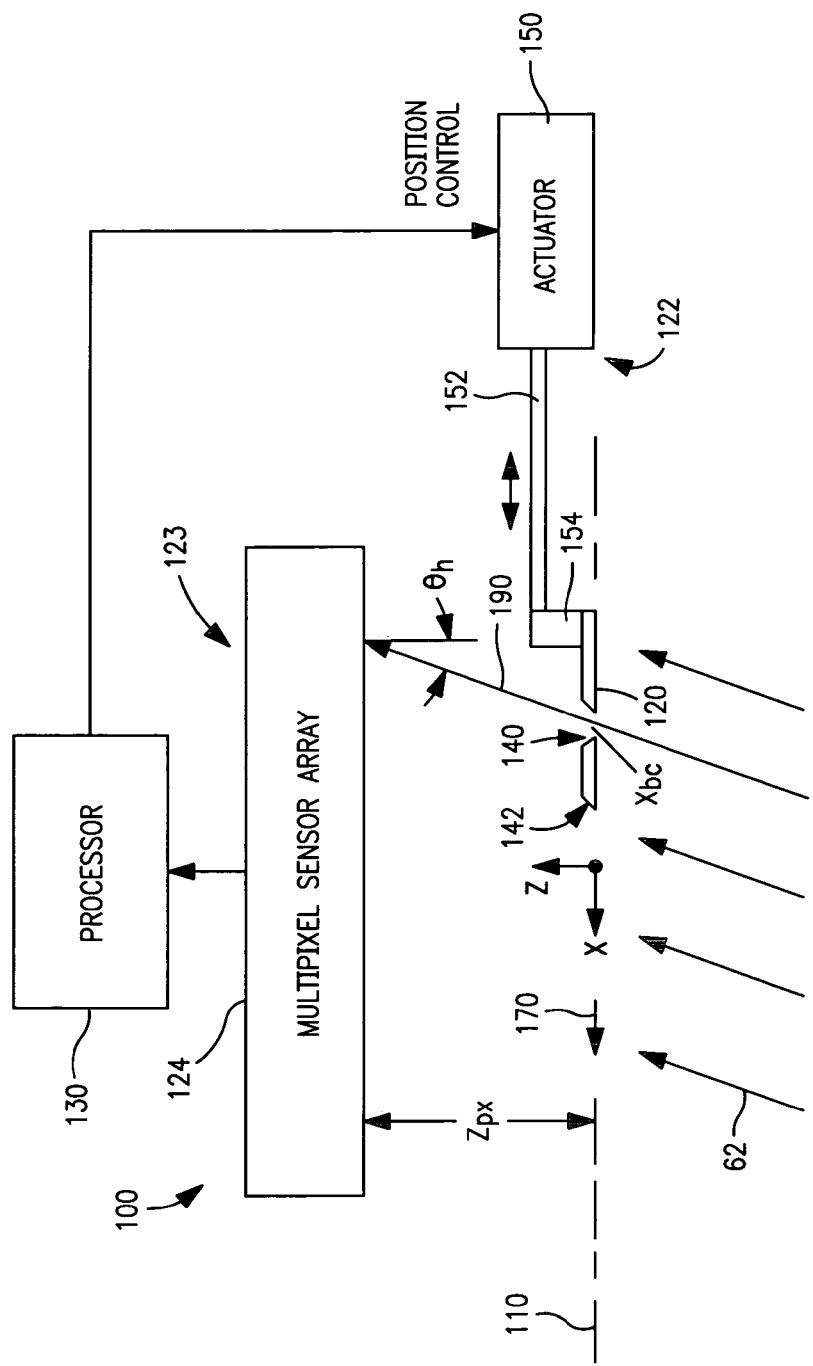
FIG. 2 is a schematic diagram of an angle measurement system in accordance with an embodiment of the invention.
Figure 3:
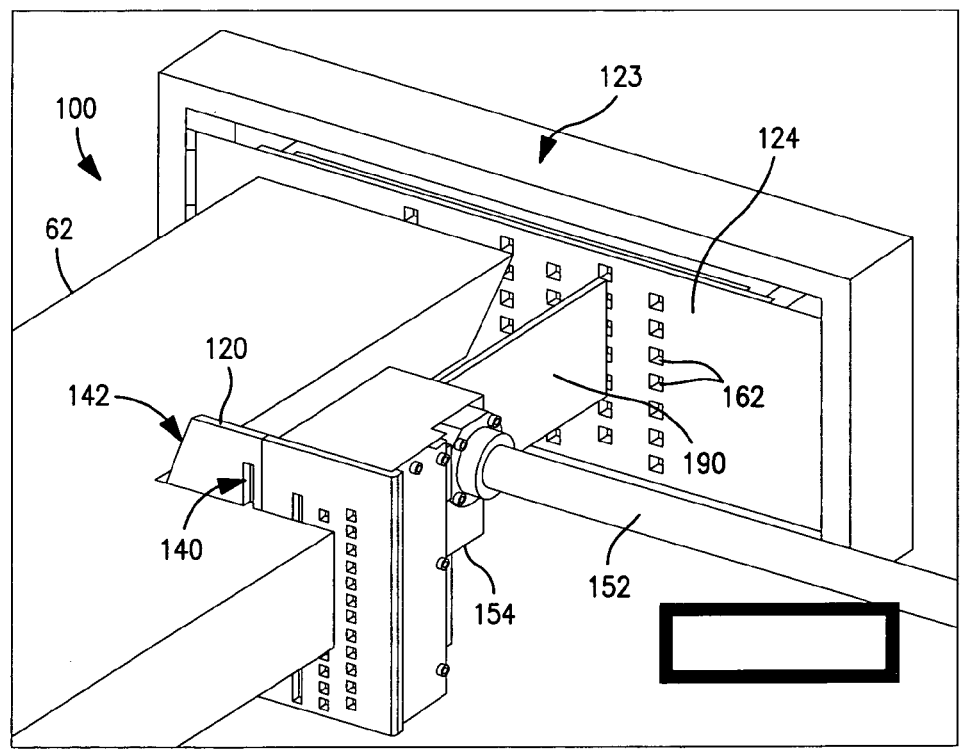
FIG. 3 is a perspective view of the angle measurement system of FIG. 2.

A block diagram of angle measurement system 100 in accordance with an embodiment of the invention is shown in FIG. 2. A perspective view of angle measurement system 100 is shown in FIG. 3. Angle measurement system 100 includes a flag 120, a translation mechanism 122 to translate flag 120 in the X direction, and a sensing device 123 positioned downstream in the Z direction from flag 120. In the embodiment of FIGS. 2 and 3, sensing device 123 is a multi-pixel sensor array 124. A processor 130 stores and/or processes sensor signals produced by sensor array 124.

Flag 120 may be a plate that includes a first feature 140 and a second feature 142, which permit ion beam angles to be measured as described below. Features 140 and 142 are described below in connection with FIG. 5. Flag 120 selectively blocks ion beam 62 as described below.

Translation mechanism 122 may include an actuator 150 coupled to flag 120 by a connecting rod 152 and a support block 154. Translation mechanism 122 translates flag 120 along a translation path 170 in the X direction in substrate plane 110.

Multi-pixel sensor array 124 is spaced from substrate plane 110 in the Z direction, and in the embodiment of FIG. 2, includes a two-dimensional array of ion beam sensors, such as Faraday cup beam current sensors. Multi-pixel sensor array 124 senses ribbon ion beam 62 for different flag positions along translation path 170. Multi-pixel sensor array 124 provides sensor signals in response to the sensed beam current. The sensor signals are supplied to processor 130 for processing to determine ion beam angles as described below. Processor 130 may supply position control signals to actuator 150.

Figure 4:
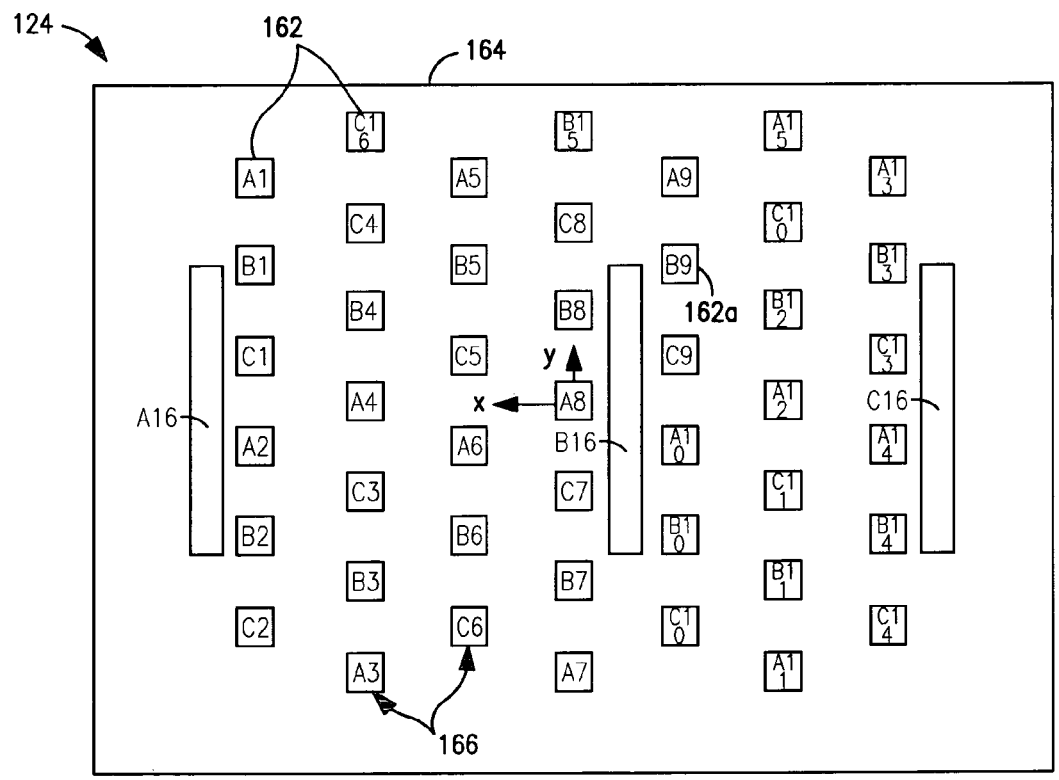
FIG. 4 is a front view of an embodiment of a multi-pixel sensor array used in the angle measurement system of FIG. 2.

Referring to FIG. 4, multi-pixel sensor array 124 may include multiple beam current sensors 162 mounted to a housing 164. Each of beam current sensors 162 may be a Faraday cup which produces an electrical signal in response to an intercepted ion beam. As known in the art, the magnitude of the sensor signal is a function of the intercepted ion beam current. Each beam current sensor may be a cup-shaped conductor with an aperture that faces the ion beam. The size of the aperture determines the area of the ion beam that is sampled by the beam current sensor. In one embodiment, 9 millimeter square apertures are utilized.

In the embodiment of FIG. 4, sensor array 124 is a two-dimensional array of beam current sensors 162 including seven spaced-apart columns 166 of beam current sensors. Individual beam current sensors within each column are equally spaced in the Y direction, and columns 166 are equally spaced in the X direction. Adjacent columns are offset in the Y direction to avoid measurement gaps.

In other embodiments, sensing device 123 may include a single beam current sensor, a linear array of beam current sensors, or an arbitrary arrangement of beam current sensors. As described below, each individual beam current sensor can be used to measure horizontal beam angle, vertical beam angle, or both at the position of each beam current sensor. A sensing device 123 having two or more beam current sensors, such as an array of beam current sensors, may be used to measure horizontal beam angle, vertical angle, or both at two or more positions in substrate plane 110. The arrangement of beam current sensors depends on the beam angle information required for a particular application. Thus, sensing device 123 may include beam current sensors at selected positions of interest relative to substrate plane 110.

Figure 5:
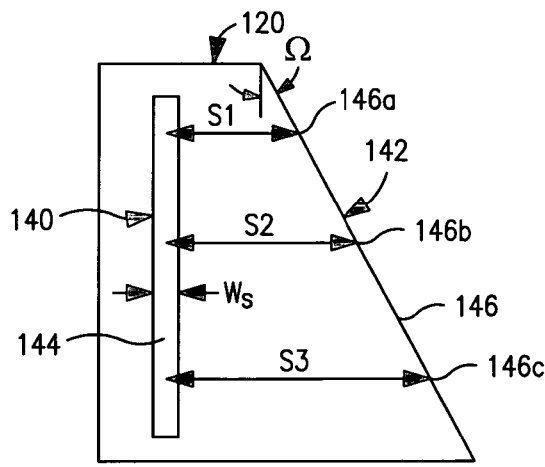
FIG. 5 illustrates a first embodiment of a flag used in the angle measurement system of FIG. 2.

A first embodiment of flag 120 is shown in FIG. 5. In FIG. 5, flag 120 is viewed in the negative Z direction, i.e. the upstream direction of the ion beam. Flag 120 may be a plate having features which permit measurement of ion beam angles. The plate may be fabricated of graphite, for example.

In the embodiment of FIG. 5, first feature 140 is a vertical slot 144 having a long dimension parallel to the Y direction, and second feature 142 is an angled edge 146 of flag 120. Preferably, the edges of the plate which define slot 144 and angled edge 146 are beveled to limit sputtering by the ion beam. Flag 120 may be any element that blocks the ion beam and includes features that permit ion beam angles to be measured as described herein.

Second feature 142 has a variable spacing from first feature 140 as a function of location on second feature 142. In the embodiment of FIG. 5, angled edge 146 has a variable spacing from slot 144 as a function of location on edge 146. Thus, for example, edge 146 and slot 144 have a spacing S1 at location 146a on edge 146; edge 146 and slot 144 have a spacing S2 at location 146b on edge 146; and edge 146 and slot 144 have a spacing S3 at location 146c on edge 146. The first and second features 140 and 142 may be straight, but are not required to be straight. In one embodiment, first and second features 140 and 142 are both straight, and one of the features is orthogonal to the direction of translation of flag 120. The first and second features 140 and 142 may be oriented at an acute angle Ω. Preferably, the angle Ω between the first and second features is in a range of about 20 to 45 degrees.

As discussed below, different embodiments of flag 120 may be utilized. Each feature of flag 120 is characterized by an edge or a slot that provides a transition between blocking the ion beam and passing the ion beam. The arrangement of features 140 and 142 permits horizontal and vertical beam angles to be measured. As used herein, a horizontal beam angle is a beam angle in an X–Z plane, and a vertical beam angle is a beam angle in a Y–Z plane.

In operation, flag 120 is translated along translation path 170 (FIG. 2) in the X direction by translation mechanism 122 so that flag 120 intercepts ion beam 62 along at least part of translation path 170. Typically, flag 120 is translated across the entire width of ion beam 62 or, in the case of a scanned ion beam, across the entire scan width. Beam current measurements are acquired from beam current sensors 162 in multi-pixel array 124 for different flag positions along the translation path 170. The beam current measurements may be acquired when flag 120 is moving or, in the case of stepwise movement, each time flag 120 stops along the translation path. The sensor signals generated by beam current sensors 162 may be measured continuously or may be sampled at desired intervals. The current measurements are supplied to processor 130 for storage in a memory. The set of current measurements for different positions of flag 120 represents ion beam angles in two dimensions. The set of current measurements may be processed to provide angle values as discussed below.

The parameters of angle measurement system 100 depend on the characteristics of ion beam 62, such as beam current and cross-sectional dimensions and shape, and on the desired angle measurement resolution and measuring speed. The height and width of multi-pixel sensor array 124 should be greater than the maximum expected height and width of ion beam 62 in order to intercept beams that are displaced from a nominal location. The size of beam current sensors 162 in array 160 depends on the desired resolution of angle measurement and on the ability of the sensor to produce an acceptable signal level. The height of flag 120 in the Y direction should be at least as great as the height of sensor array 124.

The translation of flag 120 along translation path 170 may be continuous or in discrete steps. In one embodiment, flag 120 is translated in steps equal to one-half the width of the apertures in beam current sensors 162. The translation mechanism 122 may utilize a rack and pinion drive mechanism, for example. Other suitable translation mechanisms include a ball and screw assembly, a linear motor and an air piston.

Translation flag 120 along the X direction is described herein. In other embodiments, flag 120 can be translated along the Y direction or along an arbitrary direction that causes flag 120 to intercept at least a portion of the ion beam.

As shown in FIG. 2, processor 130 may provide position control signals to actuator 150 to control translation of flag 120 along translation path 170. For example, processor 130 may control actuator 150 to translate flag 120 in steps across ion beam 62 and to record the beam current sensed by each of the beam current sensors 162 in the multi-pixel array 124 at each position of flag 120. The measured current values and the corresponding positions of flag 120 form a data set which represents beam angles at different locations in ion beam 62. The data set may be stored by processor 130.

Figure 6:
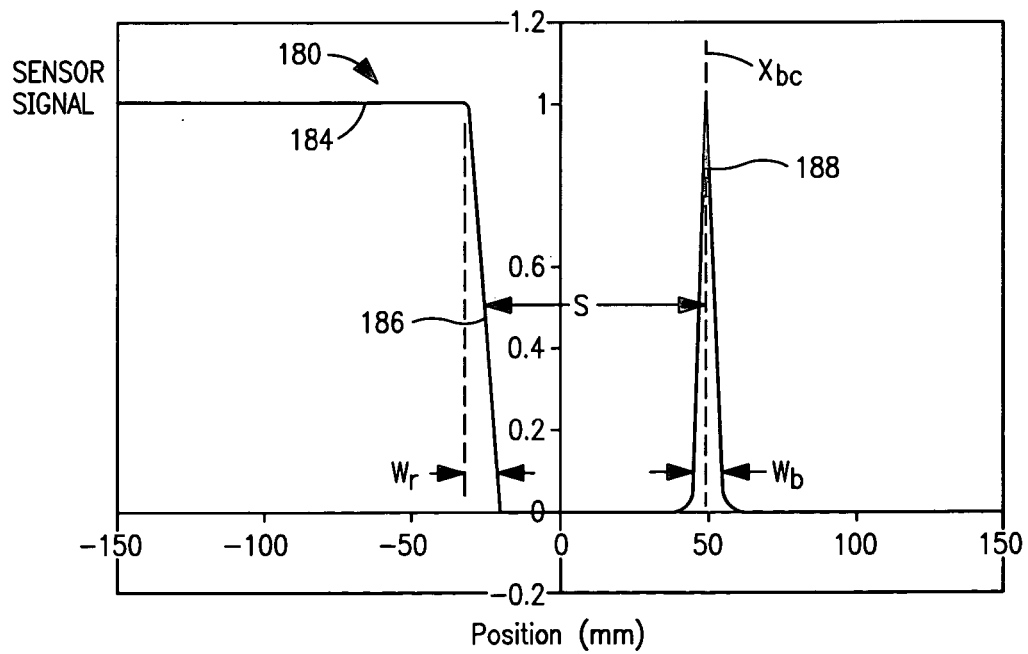
FIG. 6 illustrates an example of a sensor signal as a function of flag position.

An example of a sensor signal 180 as flag 120 is translated along translation path 170 is shown in FIG. 6. The sensor signal 180 is plotted as a function of the position of flag 120 along translation path 170. Sensor signal 180 may represent the signal generated by a beam current sensor 162a at a location $(x_{px}, y_{px})$ in sensor array 124. Flag 120 may move from a negative value of X in the positive X direction. Initially, flag 120 does not block ion beam 62 from reaching current sensor 162 a, and beam current sensor 162a produces a sensor signal of maximum value 184. As flag 120 moves in the positive X direction, angled edge 146 blocks ion beam 62 from reaching current sensor 162a, and sensor signal 180 decreases from maximum value 184 to zero, as indicated by transition 186. As flag 120 moves farther in the positive X direction, ion beam 62 remains blocked by flag 120 from reaching current sensor 162a until a portion of ion beam 62, known as a beamlet 190, that passes through slot 144 is intercepted by beam current sensor 162a. Beamlet 190 may be defined a portion of ion beam 62 that is intercepted by a beam current sensor 162, such as a beam current sensor 162a, in sensor array 124. Beamlet 190 may be formed by ions having a range of angles, depending on the characteristics of ion beam 62. Beam current sensor 162a produces a "bump" 188 in sensor signal 180 at the X position of flag 120 where beamlet 190 passes through slot 144 and is intercepted by beam current sensor 162a. Bump 188 is a peak in sensor signal 180 that depends on the width of slot 144, the aperture of beam current sensor 162a, and the beam angle spread. As flag 120 continues in the positive X direction, sensor signal 180 remains at zero. It will be understood that flag 120 can be translated in the negative X direction and that the same sensor signal is produced.

Bump 188 is a first component of sensor signal 180, which is representative of the first feature 140 (slot 144) of flag 120, and transition 186 is a second component of sensor signal 180, which is representative of the second feature 142 (angled edge 146) of flag 120. As described below, the X position of bump 188 indicates the horizontal angle of ion beam 62, and the spacing S between transition 186 and bump 188 represents the vertical angle of ion beam 62.

Figure 7A:
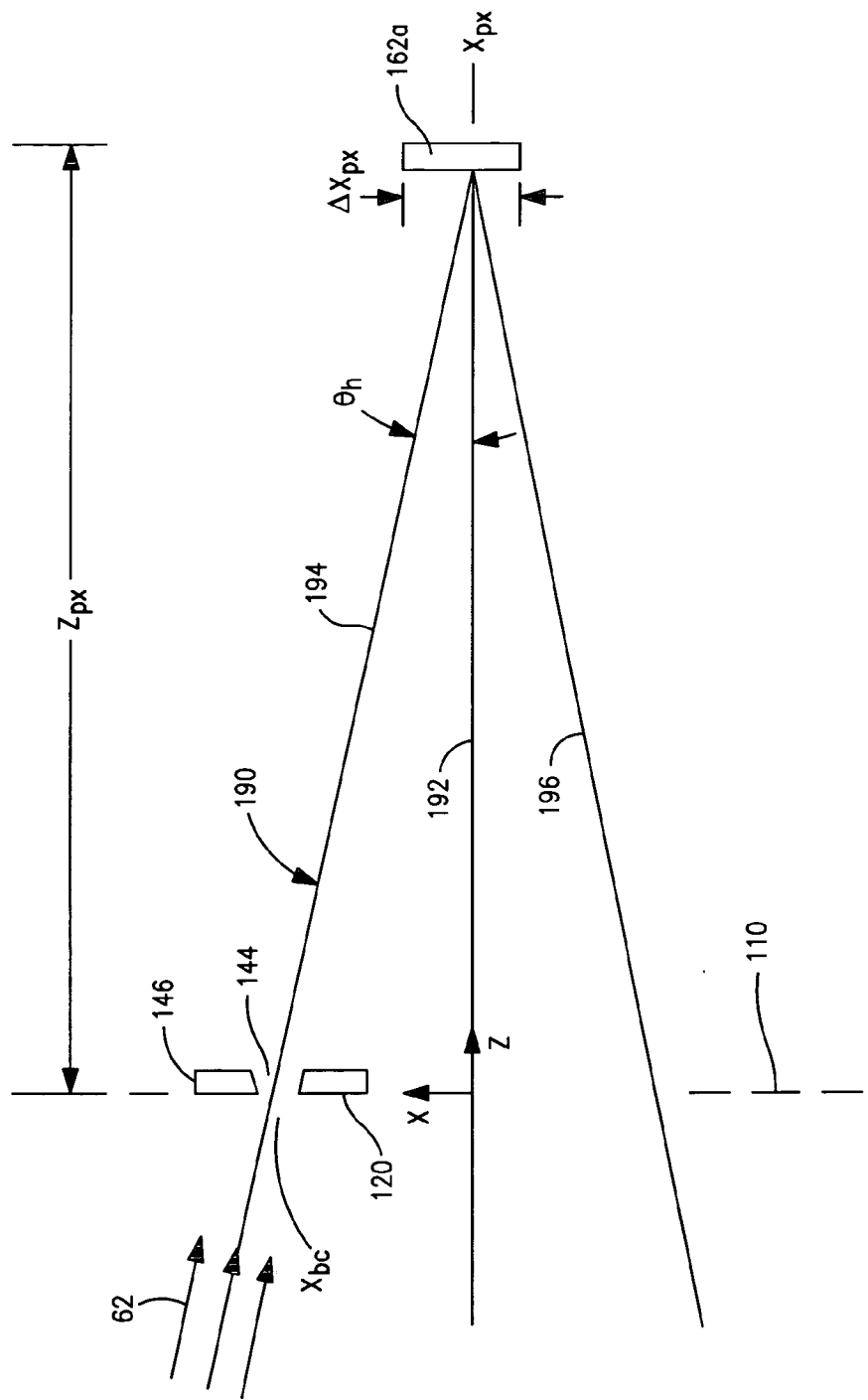
FIG. 7A is a partial schematic top view of the angle measurement system of FIG. 2.

Measurement of horizontal beam angle $\theta_h$ is described with reference to FIGS. 5, 6, 7A and 8. A schematic top view of the angle measurement system is shown in FIG. 7A. Beam current sensor 162a is shown intercepting ion beam 62 for different horizontal beam angles. As shown in FIG. 7A, the horizontal beam angle $\theta_h$ is the angle between the Z direction and ion beam 62 in a horizontal (X–Z) plane. Beamlet 190 passes through slot 144 in flag 120 and is intercepted by beam current sensor 162a in sensor array 124. The beam current sensor 162a has an X coordinate $x_{px}$, and slot 144 has an X coordinate $x_{bc}$ when beamlet 190 is intercepted by beam current sensor 162a. Sensor array 124 is spaced from flag 120 in the Z direction by a distance $z_{px}$. For this geometry, horizontal beam angle $\theta_h$ may be expressed as:

$$\tan \theta_h = (x_{px} - x_{bc})/z_{px} \qquad (1)$$

The X coordinate $x_{bc}$ of slot 144 at which beamlet 190 is intercepted by beam current sensor 162a varies as the horizontal beam angle varies. Thus, for an example of an ion beam having zero horizontal beam angle, beamlet 190 is transported along a trajectory 192 to beam current sensor 162a. For an ion beam having a negative horizontal beam angle, beamlet 190 is transported along a trajectory 194 to beam current sensor 162a; and for an ion beam having a positive horizontal beam angle, beamlet 190 is transported along a trajectory 196 to beam current sensor 162a. The direction of the displacement relative to the beam current sensor indicates the sign of the horizontal beam angle.

Figure 8:
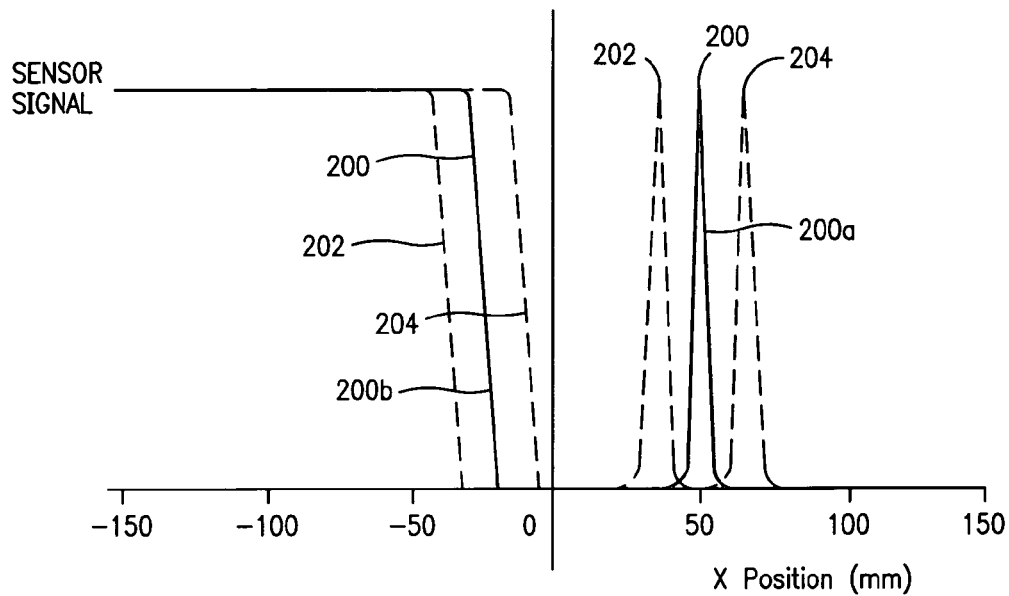
FIG. 8 is a graph of sensor signal as a function of flag position for different horizontal angles of the ion beam.

Referring to FIG. 8, sensor signals generated by beam current sensor 182 are shown for different horizontal beam angles $\theta_h$, with the vertical angle remaining constant. Sensor signal 200 represents an intermediate value of horizontal beam angle, sensor signal 202 represents a smaller value of horizontal beam angle, and sensor signal 204 represents a larger value of horizontal beam angle. In each case, the X position of the bump, such as bump 200a, in the sensor signal represents the value of the horizontal beam angle. The X positions of the bumps in sensor signals 200, 202 and 204 correspond to the X coordinate of slot 144 when beamlet 190 is intercepted by beam current sensor 162a. It may be observed that the transitions in the sensor signals due to edge 142 of slot 120, such as transition 200b, move by the same amount as the respective bumps in the case where the vertical angle remains constant.

Referring to FIG. 6, the X position of bump 188 represents the X coordinate $x_{bc}$ of slot 144 in flag 120 when beamlet 190 passes through slot 144 and is intercepted by beam current sensor 162a at Z coordinate $x_{px}$. Since the X coordinate $x_{px}$ and the Z coordinate $z_{px}$ of beam current sensor 162a are known and fixed, and the X coordinate $x_{bc}$ of slot 144 is determined from the position of bump 188, the horizontal beam angle $\theta_h$ can be determined from equation (1) above. It will be understood that beam current sensors 162 in different columns of sensor array 124 have different X coordinates $x_{px}$. The center of bump 188 is used to determine the X coordinate of beamlet 190. The center of bump 188 is defined as the point where one half of the integrated current is on either side of the bump. This location is physically where the slot center has crossed the centroid of the beamlet area at the wafer plane.

Figure 7B:
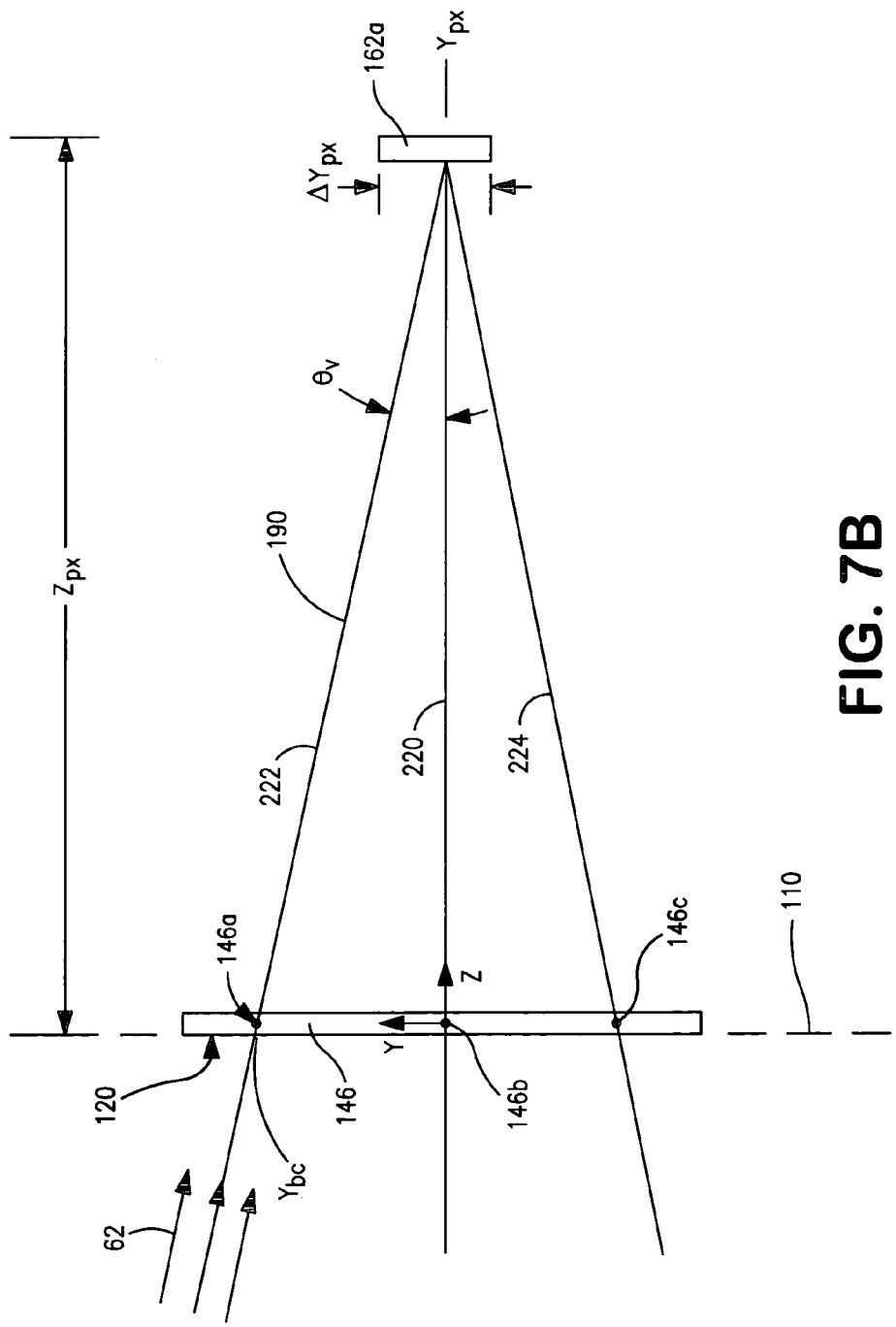
FIG. 7B is a partial schematic side view of the angle measurement system of FIG. 2.

Measurement of vertical beam angle $\theta_v$ is described with reference to FIGS. 5, 6, 7B, and 9. A schematic side view of the angle measurement system is shown in FIG. 7B. Beam current sensor 162a is shown intercepting beamlet 190 for different vertical beam angles. As shown in FIG. 7B, vertical beam angle $\theta_v$ is the angle between the Z direction and the ion beam in a vertical (Y–Z) plane. Angled edge 146 of flag 120 is shown in FIG. 7B. Beamlet 190 with zero vertical beam angle is transported along a trajectory 220 to beam current sensor 162a and intercepts edge 146 of flag 120 at location 146b. Beamlet 190 with a negative vertical beam angle is transported along a trajectory 222 to beam current sensor 162a and intercepts edge 146 of flag 120 at location 146a. Beamlet 190 with a positive vertical beam angle is transported along a trajectory 224 to beam current sensor 162a and intercepts edge 146 of flag 120 at location 146c.

As shown in FIG. 5, locations 146a, 146b, and 146c correspond to spacings S1, S2, and S3, respectively, from slot 144. The spacing between a location on edge 146 and slot 144 is indicated in the sensor signal 180 shown in FIG. 6 by a spacing S between bump 188 and transition 186. Thus, a zero vertical beam angle $\theta_v$ is indicated by a spacing S in sensor signal 180 corresponding to spacing S2, for example, in FIG. 5. Similarly, a positive vertical beam angle is indicated in sensor signal 180 by a smaller value of spacing S corresponding to spacing S1, for example, in FIG. 5; and a negative vertical beam angle is indicated in sensor signal 180 by a larger value of spacing S corresponding to spacing S3 in FIG. 5, for example. The spacing S between bump 188 and transition 186 defines the location on edge 146 where beamlet 190 was crossed and is used to determine the Y coordinate of beamlet 190. The X coordinate of bump 188 is determined as described above. The center of edge 146 is determined as the position where one half of the sensor signal occurs. This position is physically where edge 146 of flag 120 has shadowed one half of the beamlet area at the wafer plane.

Figure 9:
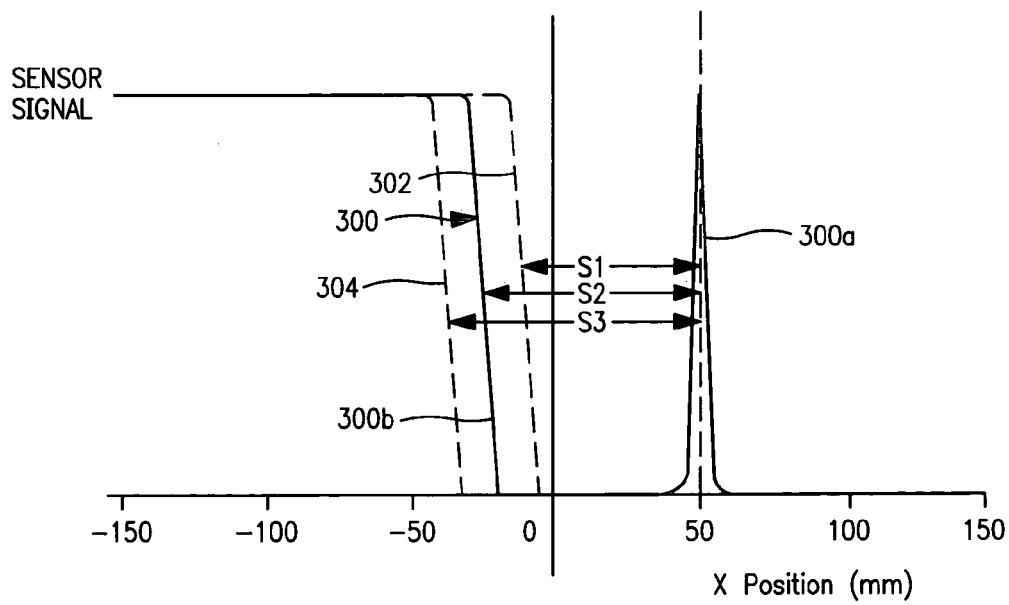
FIG. 9 is a graph of sensor signal as a function of flag position for different vertical angles of the ion beam.

Examples of sensor signals for different values of vertical beam angle $\theta_v$ are shown in FIG. 9. In FIG. 9, the horizontal beam angle $\theta_h$ is assumed to be constant. A sensor signal 300 may correspond to zero vertical beam angle, a sensor signal 302 may correspond to a negative vertical beam angle, and a sensor signal 304 may correspond to a positive vertical beam angle. Each sensor signal includes a bump, such as bump 300a, representative of slot 144 in flag 120 and a transition, such as transition 300b, representative of edge 146 of flag 120. The X position of bump 300a remains fixed for a constant horizontal beam angle. In each case, the spacing between bump 300a and the transition representative of edge 146 corresponds to the value of the vertical beam angle. Thus, a relatively small spacing, such as spacing S1, corresponds to a negative vertical beam angle, and a relatively large spacing, such as spacing S3, corresponds to a positive vertical beam angle.

As shown in FIG. 7B, beam current sensor 162a has a Y coordinate $y_{py}$, and the ion beam intersects edge 146 at Y coordinate $y_{bc}$. Beam current sensor 162a is spaced from flag 120 in the Z direction by a distance $z_{px}$. For this geometry, the vertical beam angle $\theta_v$ may be expressed as:

$$\tan \theta_v = (y_{px} - y_{bc})/z_{px} \quad (2)$$

The Y coordinate $y_{px}$ and the Z coordinate $z_{px}$ of beam current sensor 162a are known and fixed, and the Y coordinate $y_{bc}$ at which beamlet 190 crosses edge 146 is determined from spacing S between bump 188 and transition 186 in sensor signal 180. For example, the relation between spacing S and Y coordinate $y_{bc}$ can be obtained from a table. Accordingly, the vertical beam angle $\theta_v$ can be determined from equation (2) above. It will be understood that beam current sensors 162 in different rows of sensor array 124 have different Y coordinates $y_{px}$.

FIGS. 6, 8, and 9 and the accompanying descriptions relate to the sensor signals produced by a single beam current sensor 162a in sensor array 124. Beam current sensor 162a produces a sensor signal that permits the horizontal and vertical beam angles at one position in the ion beam to be determined according to equations (1) and (2), respectively. Each of the beam current sensors in sensor array 124 produces a similar sensor signal as a function of flag position. The horizontal beam angle and the vertical beam angle of ion beam 62 may vary as a function of position in substrate plane 110. The sensor array 124 measures the horizontal and vertical beam angles at multiple positions in substrate plane 110. Thus, each pixel (beam current sensor 162) at location ($x_{px}$, $y_{px}$) in sensor array 124 acquires a measurement of horizontal beam angle and a measurement of vertical beam angle. For example, in the case of an ion beam that is perfectly parallel, the beam current sensors all measure the same horizontal and vertical beam angles. In the case of a diverging ion beam, beam current sensors 162 at different locations in sensor array 124 measure different horizontal and vertical beam angles. The measurements acquired by beam current sensors 162 in sensor array 124 thus constitute a map of horizontal and vertical beam angles as a function of position in the substrate plane 110.

Sensor signals from some or all of the beam current sensors 162 in sensor array 124 may be processed provide additional information. For the case of a broad beam, either a ribbon beam or a scanned beam, beam angle changes, either horizontal or vertical, at various horizontal positions across the beam are of interest. This is because a point on the wafer intercepts the beam from one horizontal position within the beam but at that horizontal position, the wafer intercepts every part of the beam vertically due to the vertical mechanical scan of the implanter.

Accordingly, sensor signals from all beam current sensors at the same horizontal location may be processed to provide a weighted average of the horizontal and/or vertical angle measurements to obtain the average horizontal and/or vertical angle at that horizontal position. The angle measurements for each beam current sensor may be weighted by the beam current detected at that beam current sensor. For the example of a pixel array having seven vertical columns, this operation produces seven average horizontal angles and seven average vertical angles. Since the ion beam is typically made uniform as a function of horizontal position, an equally weighted average of the seven measurements defines an overall average direction of the beam. The variation within the seven averages may be defined as a beam angle spread for a converging beam. The result may be zero horizontal beam angle in the middle, positive horizontal beam angle on the negative side of the wafer and negative horizontal beam angle on the positive side of the wafer.

The angle measurement system disclosed herein maybe used to measure beam angle spread as well as beam angles. Beam angle spread is the range of angles included in ion beam 62. In the context of beamlet 190, beam angle spread is the range of angles of ions intercepted by a single beam current sensor. Sensor array 124 may be used to evaluate beam angle spread at different positions in ion beam 62, with a beam angle spread measurement made by each beam current sensor in sensor array 124. Each beam current sensor may make a measurement of horizontal beam angle spread $\phi_h$ and a measurement of vertical beam angle spread $\phi_v$. Qualitatively, horizontal beam angle spread $\phi_h$ is indicated by the width of bump 188 in sensor signal 180. Thus, a wider bump 188 is indicative of a larger horizontal beam angle spread. Similarly, vertical beam angle spread $\phi_v$ is indicated by the slope of transition 186 in sensor signal in 180. A more gradual transition 186 is indicative of a larger vertical beam angle spread.

Horizontal beam angle spread $\phi_h$ may be determined as follows.

$$\varphi_h \simeq (\Delta x_b - \Delta x_{px})/z_{px} \qquad (3)$$

$$\simeq (W_b - 2W_s - \Delta x_{px})/z_{px} \qquad (4)$$

where $\Delta x_b$ is the beamlet window width, i.e., a range of X positions over which beamlet 190 may pass through slot 144 and be intercepted by is beam current sensor 162a; $\Delta x_{px}$ is the X direction dimension of the aperture in beam current sensor 162a; $z_{px}$ is the Z direction spacing between flag 120 and beam current sensor 162a; $W_b$ is the width of the bump in sensor signal 180 measured, for example, at 0.01 of maximum amplitude; and $W_s$ is the width of slot 144. In equation (4), bump width $W_b$ is the only variable for a given configuration. Therefore, horizontal beam angle spread $\phi_h$ is expressed as a function of bump width $W_b$.

Vertical beam spread $\phi_v$, maybe determined as follows.

$$\varphi_v \simeq (\Delta y_b - \Delta y_{px})/z_{px} \qquad (5)$$

$$\simeq [(W_r - \Delta x_b)\tan\Omega - \Delta y_{px}]/z_{px} \qquad (6)$$

where $\Delta y_b$ is the beamlet window height; $\Delta y_{px}$ is the Y direction dimension of the aperture in beam current sensor 162a; $W_r$ is the width of transition 186 measured, for example, from full amplitude to 0.01 of full amplitude; $\Delta x_b$ is the beamlet window width as described above; and $\Omega$ is the angle of edge 146. In equation (6), transition width $W_r$ and beamlet window width $\Delta x_b$ (given by $W_b-2 W_s$) are the only variables for a given configuration.

The beam angle measurements may be evaluated to determine possible actions. For example, acceptable criteria may be established for beam angle parameters. If the beam angle parameters meet the acceptable criteria, ion implantation may proceed. If the beam angle parameters do not meet the acceptable criteria, the ion implanter can be adjusted to bring the beam angle parameters within the acceptable criteria. In another approach, the wafer can be tilted as described in U.S. Pat. No. 6,437,350, which is hereby incorporated by reference, to bring the beam angle parameters within the acceptable criteria.

Figure 10:
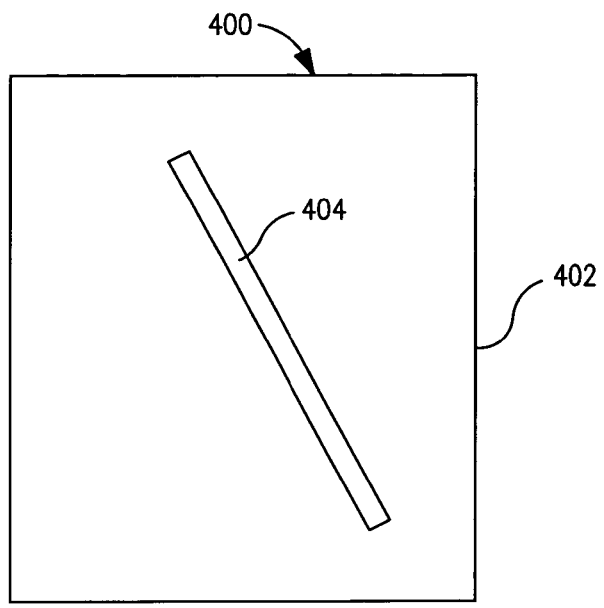
FIG. 10 illustrates a second embodiment of an a flag according to the invention.
Figure 11:
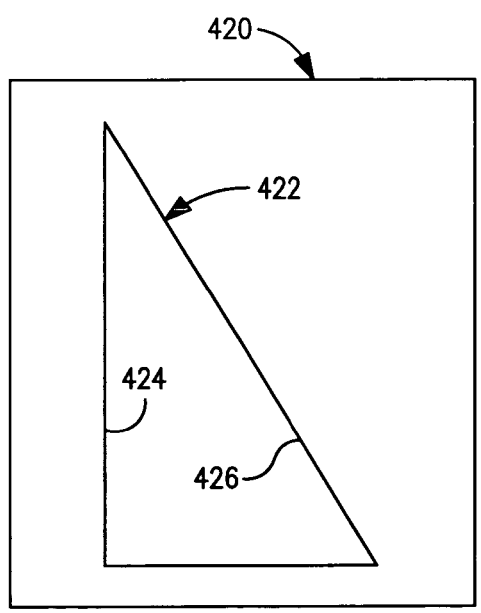
FIG. 11 illustrates a third embodiment of a flag according to the invention.
Figure 12:
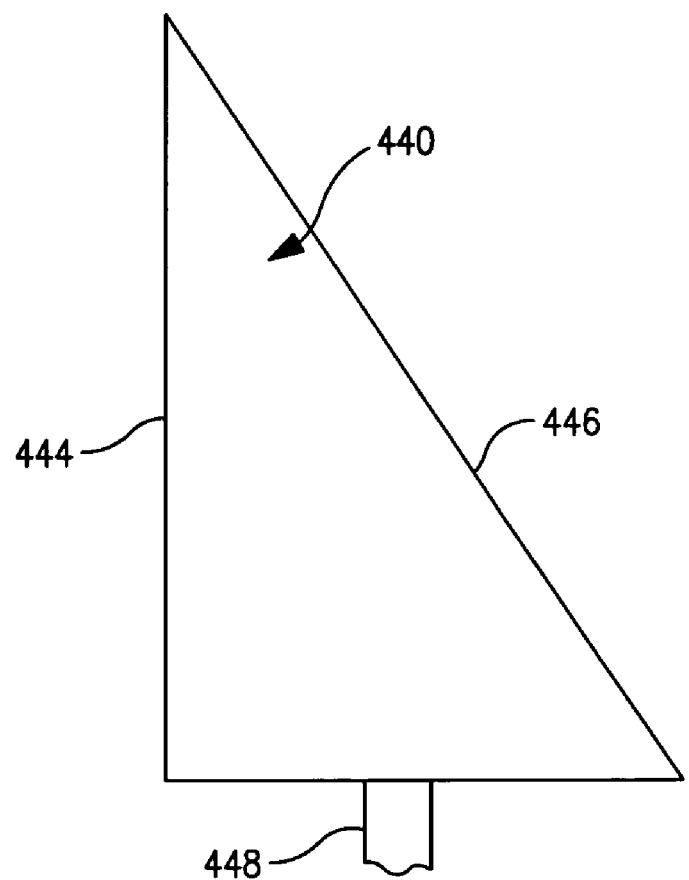
FIG. 12 illustrates a fourth embodiment of a flag according to the invention.

Other suitable flag configurations are shown in FIGS. 10–12. As shown in FIG. 10, a flag 400 includes a first feature in the form of a vertical outside edge 402 and a second feature in the form of an angled slot 404. In the embodiment of FIG. 10, the position of the bump in the sensor signal resulting from slot 404 moves as a function of vertical beam angle and the position of the transition produced by edge 402 moves as a function of horizontal beam angle.

As shown in FIG. 11, a flag 420 includes a first feature in the form of a vertical edge 424 and a second feature in the form of an angled edge 426, both of which are inside edges of an aperture 422 in flag 420. Vertical edge 424 produces a transition in the sensor signal that is used to determine horizontal beam angle, and angled edge 426 produces a transition in the sensor signal that is used to measure vertical beam angle.

As shown in FIG. 12, a flag 440 includes a first feature in the form of a vertical edge 444 and a second feature in the form of an angled edge 446, both of which are outside edges of flag 440. Vertical edge 444 produces a transition in the sensor signal that is used to measure horizontal beam angle, and angled edge 446 produces a transition in the sensor signal that is used to measure vertical beam angle. Flag 440 may be supported by a post 448 for translation along a translation path.

Different ion beam types can be measured by the angle measurement system disclosed herein. A ribbon ion beam typically has an elongated cross-section characterized by a beam height and a beam width. The height of the sensor array 124 in the Y direction is selected to be greater than the beam height to permit beam angle measurement at the maximum expected vertical beam angle. The length of translation path 170 in the X direction is selected to be equal to or greater than the beam width. It is most practical to translate the flag 120 along the long dimension of the ion beam cross-section. However, the invention is not limited in this regard.

The angle measurement system of the present invention can be utilized to acquire angle measurements of a scanned ion beam. The ion beam is scanned in a scan direction to provide a scan pattern. The angle measurement system can be utilized to obtain beam angle measurements over the area of the scan pattern. The flag 120 is translated in the scan direction, and the translation path 170 has a length equal to or greater than the scan pattern. The speed of translation of flag 120 is slow in comparison with the beam scanning speed to ensure that the ion beam angle is measured at least once at each position along the translation path.

The angle measurement system of the present invention can be utilized to acquire angle measurements of a fixed spot ion beam. The height and width of sensor array 124 are both greater than the diameter of the spot ion beam to permit beam angle measurement at the maximum expected beam angles. The spot ion beam does not necessarily have a circular cross-section and in general has an irregular cross-sectional shape.

Figure 13:
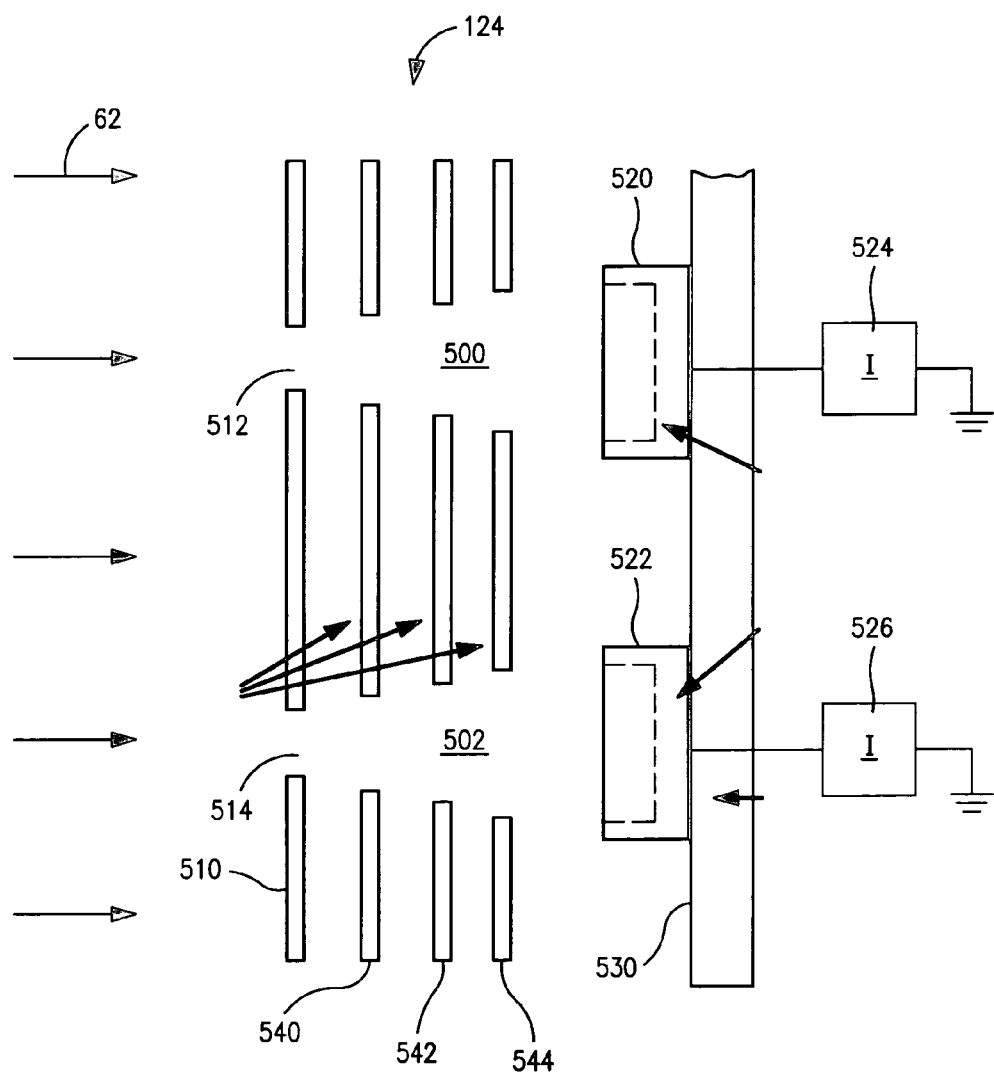
FIG. 13 is a partial cross-sectional schematic diagram of the sensor array of FIG. 4.

A partial cross-sectional schematic diagram of sensor array 124 is shown in FIG. 13. Beam current sensors 500 and 502 of sensor array 124 are shown. An aperture plate 510 having apertures 512 and 514 defines the areas of ion beam 62 that are sensed by the respective beam current sensors. In particular, aperture 512 defines a sensor area of beam current sensor 500, and aperture 514 defines a sensor area of beam current sensor 502. Each aperture has dimensions ($\Delta x_{px}$, $\Delta y_{px}$), as shown in FIGS. 7A and 7 B. Beam current sensors 500 and 502 further include collector cups 520 and 522, respectively, mounted to support plate 530. Collector cups 520 and 522 are connected to ground through current sensors 524 and 526, respectively.

One of the difficulties in measuring beam angles, particularly when measuring low ion beam currents, is to ensure that only the current due to the ion beam is measured. The angle measurement system operates in a region of the ion implanter where electrons and low energy ions are also present, generated both through collisions of the ion beam with the background gas and by introduction from an electron flood gun used to neutralize charge on the wafer. The sensor array 124 may be provided with suppression elements for suppressing entry of electrons and low energy ions into the beam current sensors.

In the embodiment of FIG. 13, sensor array 124 includes first, second and third electrostatic suppression electrodes 540, 542 and 544 positioned between aperture plate 510 and collector cups 520 and 522. Each of suppression electrodes 540, 542 and 544 includes apertures aligned with the apertures in aperture plate 510. By way of example, aperture plate 510 can be grounded. First suppression electrode 540 and third suppression electrode 544 may be biased at −50 to −1000 volts, and second suppression electrode 542 may be biased at +50 to +500 volts. In one example, electrodes 540 and 544 are biased at −500 volts and electrode 542 is biased at +100 volts. It will be understood that these values are given by way of example only and are not limiting as to the scope of the present invention.

The embodiment of FIG. 13 includes electrostatic suppression elements. In other embodiments, magnetic suppression elements or a combination of electrostatic and magnetic suppression elements may be utilized. In one example, a single electrostatic suppression electrode may be utilized.

Having thus described at least one illustrative embodiment of the invention, various alterations, modifications, and improvements will readily occur to those skilled in the art. Such alterations, modifications, and improvements are intended to be within and scope of the invention. Accordingly, the foregoing description is by way of example only and is not intended as limiting. The invention is limited only as defined in the following claims and the equivalents thereto.

What is claimed is:

1. An angle measurement system for an ion beam, comprising:
    a flag defining a first feature and a second feature, wherein the second feature has a variable spacing from the first feature as a function of location on the second feature;
    a mechanism to translate the flag along a translation path so that the flag intercepts at least a portion of the ion beam; and
    a sensing device to detect the ion beam for different flag positions along the translation path and to produce in response to the detected ion beam a sensor signal having a first signal component representative of the first feature and a second signal component representative of the second feature, wherein the first and second signal components and corresponding positions of the flag are representative of an angle of the ion beam in a direction orthogonal to the translation path.

2. An angle measurement system as defined in claim 1, wherein at least one of the first and second features comprises a slot in the flag.

3. An angle measurement system as defined in claim 1, wherein at least one of the first and second features comprises an outside edge of the flag.

4. An angle measurement system as defined in claim 1, wherein at least one of the first and second features comprises inside edge of an aperture in the flag.

5. An angle measurement system as defined in claim 1, wherein the first feature comprises a slot in the flag and the second feature comprises an angled edge of the flag.

6. An angle measurement system as defined in claim 1, wherein the first and second features are straight.

7. An angle measurement system as defined in claim 6, wherein the first and second features are oriented at an acute angle.

8. An angle measurement system as defined in claim 1, wherein the first feature is orthogonal to the translation path.

9. An angle measurement system as defined in claim 1, wherein the sensing device comprises one or more beam current sensors positioned to intercept the ion beam.

10. An angle measurement system as defined in claim 1, wherein the sensing device comprises a linear array of beam current sensors.

11. An angle measurement system as defined in claim 1, wherein the sensing device comprises a two-dimensional array of beam current sensors.

12. An angle measurement system as defined in claim 1, further comprising a processing device responsive to the sensor signal for determining a horizontal beam angle in a horizontal plane and a vertical beam angle in a vertical plane.

13. An angle measurement system as defined in claim 12, wherein the sensing device comprises a two-dimensional array of beam current sensors and wherein the processing device is configured to average sensor signals along a row or a column of the two-dimensional array.

14. An angle measurement system as defined in claim 12, wherein the sensing device comprises a two-dimensional array of beam current sensors and wherein the processing device is configured to average sensor signals over the two-dimensional array.

15. An angle measurement system as defined in claim 1, further comprising a processing device responsive to the sensor signal for determining a vertical beam angle in a vertical plane.

16. An angle measurement system as defined in claim 1, wherein the sensing device comprises a two-dimensional array of beam current sensors, further comprising a processing device responsive to the sensor signals for determining a vertical beam angle at each sensor location in the two-dimensional array.

17. An angle measurement system as defined in claim 1, wherein the sensing device comprises a two-dimensional array of beam current sensors, further comprising a processing device responsive to the sensor signals for determining a map of beam angle as a function of beam current sensor location in the two-dimensional array.

18. A method for measuring an angle of an ion beam, comprising:
    providing a flag defining a first feature and a second feature, wherein the second feature has a variable spacing from the first feature as a function of location on the second feature;
    translating the flag along a translation path so that the flag intercepts at least a portion of the ion beam; and
    detecting the ion beam for different flag positions along the translation path and producing in response to the detected ion beam a sensor signal having a first signal component representative of the first feature and a second signal component representative of the second feature, wherein the first and second signal components and corresponding positions of the flag are representative of an angle of the ion beam in a direction orthogonal to the translation path.

19. A method as defined in claim 18, further comprising processing the sensor signal to provide a measurement of vertical beam angle.

20. A method as defined in claim 18, further comprising processing the sensor signal to provide a measurement of vertical beam angle and horizontal beam angle.

21. A method as defined in claim 18, wherein detecting the ion beam comprises detecting the ion beam with a two-dimensional array of beam current sensors to provide measurements of beam angle at multiple positions in a substrate plane.

22. A method as defined in claim 20, wherein detecting the ion beam comprises detecting the ion beam with a two-dimensional array of beam current sensors to provide measurements of vertical beam angle and horizontal beam angle at multiple positions in a substrate plane.

23. A method as defined in claim 18, wherein detecting the ion beam comprises detecting the ion beam with a two-dimensional array of beam current sensors, further comprising processing the sensor signals along a row or a column of the two-dimensional array to provide an average value of beam angle along the row or the column.

24. A method as defined in claim 18, wherein detecting the ion beam comprises detecting the ion beam with a two-dimensional array of beam current sensors, further comprising processing the sensor signals from the two-dimensional array of beam current sensors to provide an average value of beam angle over the ion beam.

25. A method as defined in claim 18, wherein detecting the ion beam comprises detecting the ion beam with a two-dimensional array of beam current sensors, further comprising processing the sensor signals from the two-dimensional array of beam current sensors to provide a measurement of beam angle spread.

26. A method as defined in claim 18, further comprising processing the sensor signal to provide a beam angle measurement and adjusting the ion beam if the measured beam angle does not meet a predetermined criteria.

27. A method as defined in claim 18, further comprising processing the sensor signal to provide a beam angle measurement and tilting a substrate relative to the ion beam if the measured beam angle does not meet a predetermined criteria.

* * * * *